(12) United States Patent
Kosinski

(10) Patent No.: US 7,067,964 B1
(45) Date of Patent: Jun. 27, 2006

(54) PIEZOELECTRIC RESONATOR WITH REDUCED DEFORMATION SENSITIVITY

(75) Inventor: John A. Kosinski, Neptune, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/847,683

(22) Filed: May 14, 2004

(51) Int. Cl.
*H01L 41/053* (2006.01)

(52) U.S. Cl. ..................................................... 310/348

(58) Field of Classification Search ........ 310/348–356; 257/678, 680
See application file for complete search history.

(56) References Cited

U.S. PATENT DOCUMENTS

| | | | | |
|---|---|---|---|---|
| 4,017,753 A | * | 4/1977 | Ishiwata et al. | 310/368 |
| 4,381,471 A | * | 4/1983 | Filler et al. | 310/353 |
| 4,741,076 A | * | 5/1988 | Vig | 29/25.35 |
| 5,006,750 A | * | 4/1991 | Besson et al. | 310/348 |
| 6,310,422 B1 | * | 10/2001 | Satoh et al. | 310/313 R |
| 6,800,986 B1 | * | 10/2004 | Yamauchi | 310/348 |
| 2003/0015942 A1 | * | 1/2003 | Takeshima et al. | 310/348 |

* cited by examiner

*Primary Examiner*—Darren Schuberg
*Assistant Examiner*—J. Aguirrechea

(74) *Attorney, Agent, or Firm*—MIchael Zelenka; George B. Tereschuk

(57) ABSTRACT

Reliable piezoelectric restraint mechanisms are provided that substantially reduce the ill effects of acceleration sensitivity through an increasingly rigid and precise orientation system. The piezoelectric resonator stress relief apparatus, devices and systems of the present invention resolve the long-standing disadvantages, limitations and shortcomings of acceleration sensitive resonators by stacking a number of rigid plates, layers and spring cushions around the piezoelectric resonator by means of a mounting structure that provides in-plane stress relief and precise definition of the mounting plane. The piezoelectric resonator stress relief apparatus, device and system can essentially eliminate any deformation or may include precisely defined features to tailor the allowed deformation of the piezoelectric resonator, without suffering from the long-standing disadvantages, limitations and shortcomings of prior art acceleration sensitive resonators. The piezoelectric resonator may be a bulk acoustic wave resonator (BAW) comprising a plano-plano, plano-convex or bi-convex thickness profile, or a surface acoustic wave resonator (SAW) comprising a plano-plano thickness profile. Spring cushions that may be formed as either separate components or assembled together with a piezoelectric resonator and a means for lateral restraint provide the in-plane stress relief. In other embodiments, the spring cushions may be an integral part of either the crystal resonator or lateral restraint or as part of a monolithic resonator-spring-restraint assembly.

72 Claims, 4 Drawing Sheets

PIEZOELECTRIC RESONATOR WITH REDUCED DEFORMATION SENSITIVITY

GOVERNMENT INTEREST

The invention described herein may be manufactured, used, and licensed by or for the United States Government for governmental purposes without payment to me of any royalties thereon.

FIELD OF THE INVENTION

The invention relates generally to piezoelectric resonators and particularly to mounting and packaging piezoelectric resonators to minimize deformation.

BACKGROUND OF THE INVENTION

Piezoelectric resonators are well known in the art. Piezoelectric resonators are electronic elements used to make a frequency stable and selectable. Piezoelectric resonators are widely used in various kinds of electronic equipment including communication systems, intelligence sensors, precision guided munitions, cordless telephones, broadcast and television, satellite telecommunication, electronic clocks, digital instruments and so on. Piezoelectric resonators can also be used as sensors of temperature, pressure, and weight. The properties of the crystal resonator depend on the angles of cut. Metal electrodes are disposed upon the crystal wafer, which is mounted in a structure designed to hold the crystal wafer. This crystal and holder assembly is called a piezoelectric resonator. Piezoelectric crystal devices are used primarily for precise frequency control and timing. Quartz is the most widely used piezoelectric material. Quartz resonators are manufactured by cutting wafers from the mother crystal along precisely controlled directions with respect to the crystallographic axes. A quartz crystal acts as a stable mechanical resonator, which, by its piezoelectric behavior and high Q, determines the frequency generated in an oscillator circuit. Bulk-wave resonators are available in the frequency range from about 1 kHz to 200 MHz. Surface-acoustic wave (SAW) and shallow-bulk-acoustic-wave devices can be made to operate at well above 1 GHz.

A typical low noise oscillator uses a crystal resonator as the frequency-determining element. An understanding of the fundamental nature of acceleration sensitivity in crystal oscillators resides primarily in understanding the behavior of the crystal resonator. The driving factor behind the acceleration-induced frequency shift is shown to be deformation of the resonator. The deformation drives two effects: an essentially linear change in the frequency determining dimensions of the resonator and an essentially nonlinear effect of changing the velocity of the propagating wave.

In a similar fashion, the frequency of a piezoelectric resonator is also affected by other stresses that deform the resonator, including gravitational stress, vibration and shock, temperature, aging, thermal hysteresis and so on. Even the acceleration due to gravity produces measurable effects and the frequency of a piezoelectric resonator can shift significantly when turned upside down due to gravity. For example, when an oscillator using an AT-cut crystal is turned upside down, the frequency typically shifts about $4 \times 10^{-9}$ and acceleration sensitivity of an AT-cut crystal is typically $2 \times 10^{-9}$ $g^{-1}$. The sensitivity is the same when the crystal is subjected to vibration, i.e., the time-varying acceleration due to the vibration modulates the frequency at the vibration frequency with amplitude of $2 \times 10^{-9}$ $g^{-1}$. In the frequency domain, the vibration sensitivity manifests itself as vibration-induced sidebands that appear at plus and minus the vibration frequency away from the carrier frequency. The acceleration sensitivity of SC-cut crystals can be made to be substantially less than that of comparably fabricated AT- or BT-Cut crystals.

The stresses caused by acceleration, vibration and shock are well-known to those skilled in the art. Periodic acceleration in the form of vibration can cause frequency modulation in piezoelectric resonators, and shock can cause a step frequency change in a piezoelectric resonator due to the piezoelectric resonator's acceleration sensitivity. Shock can also cause a permanent frequency change in a piezoelectric resonator if either the supporting structure or the electrodes are stressed beyond their elastic limits. If during shock the elastic limits in the crystal's support structure or in its electrodes are exceeded, the shock can produce a permanent frequency change. Crystal units made with chemically polished plates can withstand shocks in excess of 20,000 g. Such crystals have been successfully fired from howitzers, however this ability to withstand shock is not typical. Therefore the stresses caused by acceleration, vibration and shock and the consequent significant effects on piezoelectric frequency instability have caused prior art piezoelectric resonators to suffer from numerous disadvantages, limitations and shortcomings.

Thus, there has been a long-felt need to provide piezoelectric structures that reduce the undesirable and harmful effects of the stresses caused by acceleration, vibration and shock sensitivity and provide affordable and easy to produce piezoelectric resonators. As a general trend, each order of magnitude in precision of determining the device aspect ratio yields an order of magnitude reduction in the acceleration sensitivity being compensated. For example, if we try to build a length to width ratio of 2:1, making the device 2 mm +/−0.001 mm will be about 10 times better than building it 2 mm +/−0.01 mm, and so on. This inventor has observed that whenever the +/−tolerance is reduced by a factor of 10, the acceleration sensitivity aspect ratio compensation improves by about the same order of magnitude. In accordance with the present invention, achieving tolerances on the order of microns=0.001 mm should be feasible, as compared to the 1 mm tolerance of the prior art. The structures of the present invention provide reliable piezoelectric restraint mechanisms that substantially reduce the ill effects of acceleration sensitivity through an increasingly rigid and precise orientation system. The innovative piezoelectric resonator stress relief apparatus and systems of the present invention resolve the long-standing disadvantages, limitations and shortcomings of prior art acceleration sensitive resonators by stacking a number of rigid plates, layers and spring cushions around the piezoelectric resonator by means of a mounting structure that provides in-plane stress relief and precise definition of the mounting plane. The piezoelectric resonator stress relief apparatus and structures of the present invention can essentially eliminate any deformation or may include precisely defined features to tailor the allowed deformation of the piezoelectric resonator, without suffering from the long-standing disadvantages, limitations and shortcomings of prior art acceleration sensitive resonators.

SUMMARY OF THE INVENTION

It is an object of the present invention to minimize piezoelectric resonator deformation.

It is another object of the present invention to minimize piezoelectric resonator deformation and precisely control piezoelectric resonator deformation.

It is still a further object of the present invention is to provide a practical means for mounting and packaging a piezoelectric resonator to minimize piezoelectric resonator deformation and precisely control piezoelectric resonator deformation.

It is yet another object of the present invention is to provide a practical means for mounting and packaging a piezoelectric resonator, and precisely controlling resonator deformation using aspect-ratio compensation.

These and other objects and advantages are provided by piezoelectric resonator stress relief apparatus of the present invention comprising a piezoelectric resonator held by means of a mounting structure that provides in-plane stress relief and precise definition of the mounting plane with respect to out-of-plane stresses. The mounting plane may be simple in order to essentially eliminate any deformation or it may include precisely defined features to tailor the allowed deformation of the piezoelectric resonator. The piezoelectric resonator may be a bulk acoustic wave resonator (BAW) comprising a plano-plano, plano-convex or bi-convex thickness profile, or a surface acoustic wave resonator (SAW) comprising a plano-plano thickness profile. Spring cushions that may be formed as either separate components or assembled together with a piezoelectric resonator and a means for lateral restraint provide the in-plane stress relief. In other embodiments, the spring cushions may be an integral part of either the crystal resonator or lateral restraint or as part of a monolithic resonator-spring-restraint assembly.

The lateral profiles of both the resonator and restraint are illustrated as rectangular, however, circular and oval geometries are other likely embodiments for this invention. The present invention also contemplates a piezoelectric resonator stress relief device, a piezoelectric resonator stress relief device, a piezoelectric resonator stress relief packaging system and a monolithic piezoelectric resonator stress relief packaging system.

These and other objects, advantages, and features will become readily apparent in view of the following descriptions.

DETAILED DESCRIPTION OF THE DRAWINGS

Figure 1:
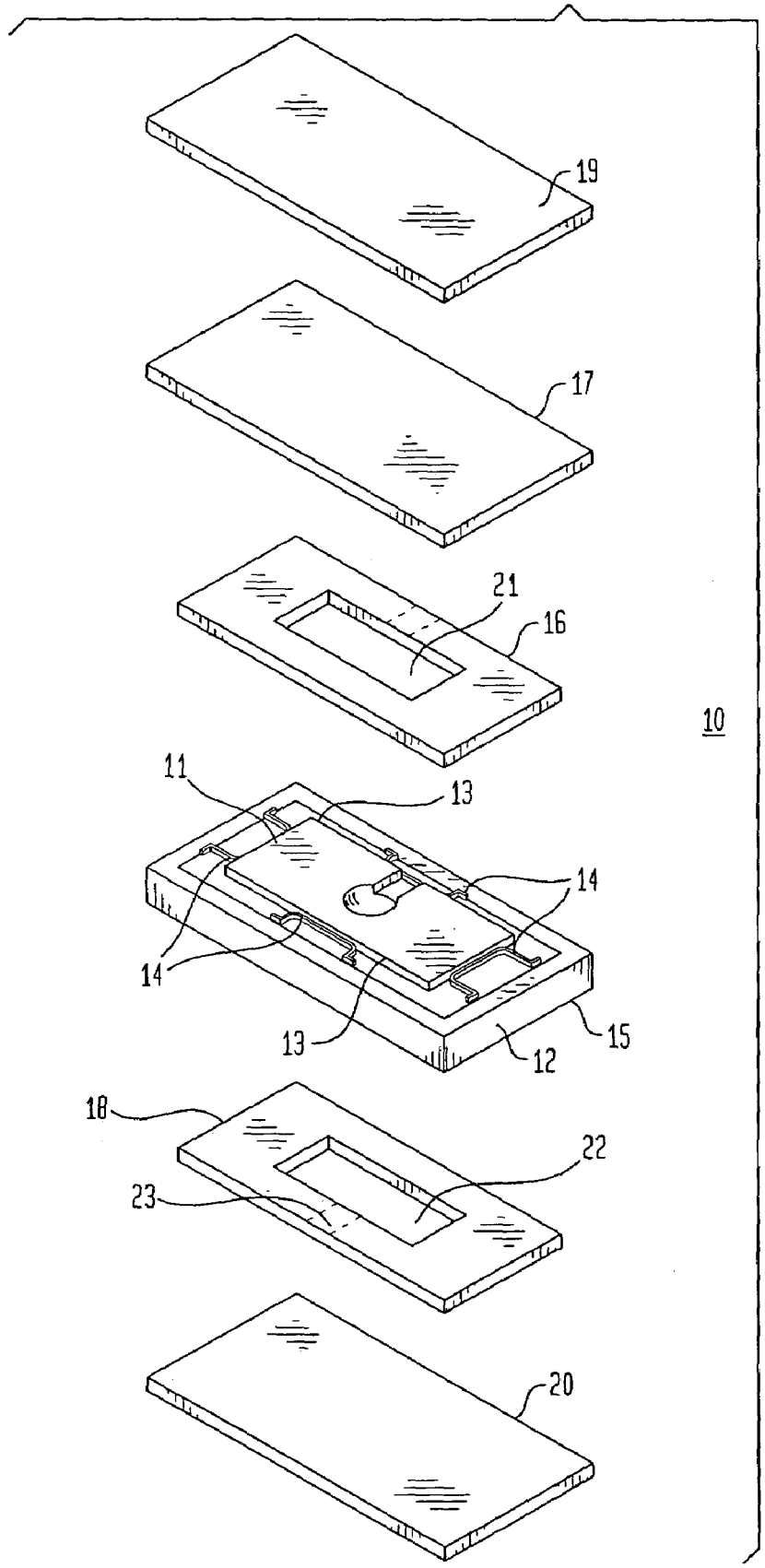
FIG. 1 is a breakaway perspective view of the piezoelectric resonator stress relief apparatus of the present invention.

Referring now to the drawings, FIG. 1 is a breakaway perspective view of the piezoelectric resonator stress relief apparatus 10 of the present invention depicting a number of different layers and assemblies. The piezoelectric resonator restraint assembly 15 further comprises a piezoelectric resonator plate 11 held steady on one surface of a means for lateral restraining 12 by a plurality of spring cushions 14 along the edges 13 of resonator 11. The piezoelectric resonator stress relief apparatus 10 of the present invention further comprises stacking the piezoelectric resonator restraint assembly 15 between an upper plate 16, a vertical tensioner gasket 17 and a lower plate 18. The upper and lower plates, 16 and 18 respectively, are also enclosed by an upper lid 19 and lower lid 20, respectively. The rectangular crystal piezoelectric resonator plate 11 provides precise orientation, and the plurality of spring cushions 14 on each horizontal side 13 of crystal resonator 11 provide in-plane stress relief.

Upper lid 19 is disposed upon a vertical tensioner gasket 17, which is a thermal expansion gasket used to alleviate excessive vertical pre-tensioning. Gasket 17 is stacked on upper plate 16. Gasket 17 should be compatible with high-vacuum conditions, but must be more compressible than the essentially incompressible piezoelectric resonator plate 11, spring cushions 14, plates 16 and 18 and the other component parts of the present invention to allow for thermal expansion. Gasket 17 can also be configured with a predetermined thermal expansion in order to compensate for the other components.

The rigid definition of the lateral restraining means 12 is accomplished by stacking the piezoelectric resonator restraint assembly 15 between the rigid upper and lower plates 16 and 18; Upper plate 16 and lower plate 18 are preferably formed from a material with maximal stiffness per unit weight and absolute stiffness equal to or greater than that of the piezoelectric resonator plate 11. An example of a suitable material for the upper plate 16 and lower plate 18 would be alumina ceramic.

Upper plate 16 and lower plate 18 are depicted with a first and a second opening 21 and 22, respectively, in the center of their major surfaces. In operation, the first and second openings 21 and 22 provide for two functions. First, they provide traction-free surfaces on the piezoelectrically active areas of the piezoelectric resonator plate 11. Secondly, the openings 21 and 22 allow for application of aspect-ratio compensation to minimize the out-of-plane acceleration-induced frequency shift. In accordance with the present invention, reduced out-of-plane acceleration-induced deformation is readily negated by an aspect-ratio compensation that is applied through the first and second openings 21 and 22. The lateral restraint means 12 and its spring cushions 14 impinging on the piezoelectric resonator plate 11 permit an in-plane stress relief that minimizes lateral movement and a reduced in-plane acceleration-induced deformation. The structures of the present invention provide reduced out-of-plane acceleration-induced deformation and reduced in-plane acceleration-induced deformation that result in a more precise aspect ratio yield, a decreased acceleration sensitivity and a decreased amount of acceleration-induced frequency shifts in the resonator 11. Further, the innovative structure of the present invention reduces the allowed in-plane effects of acceleration to a simple translation as determined by the spring cushions 14, disposed upon each horizontal side 13 of the piezoelectric resonator plate 11. In-plane stress relief in accordance with the present invention reduces the out-of-plane acceleration-induced deformation to a simple flexure, whose overall effects, inclusive of in-plane stretch and thickness compression, can be negated through aspect-ratio compensation. The lower plate 18 is disposed upon lower lid 20.

Figure 2:
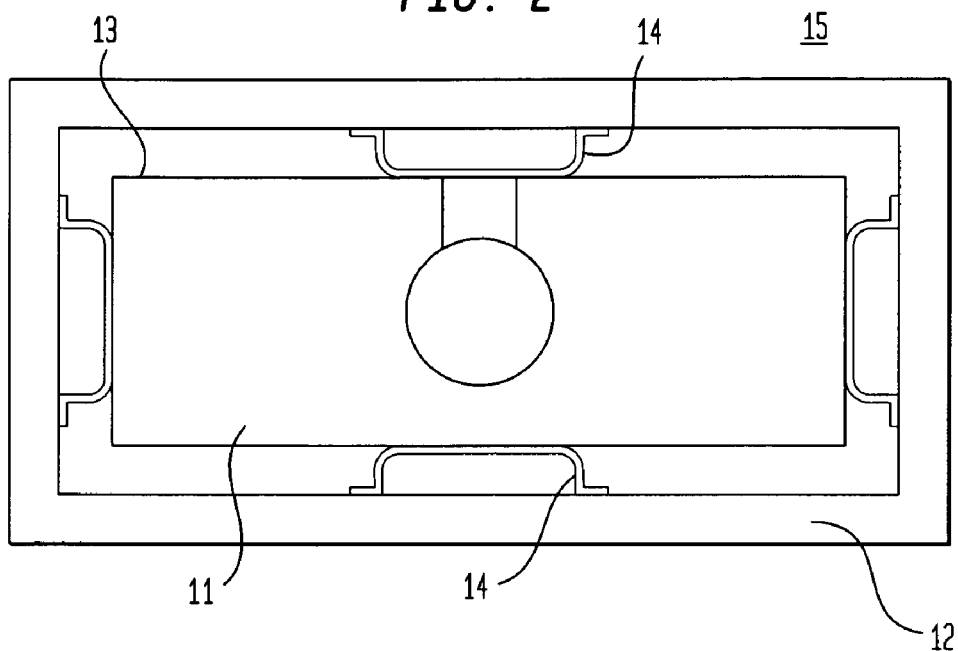
FIG. 2 is a top view of the means for lateral restraining the piezoelectric resonator of the piezoelectric resonator stress relief device of the present invention.
Figure 3:
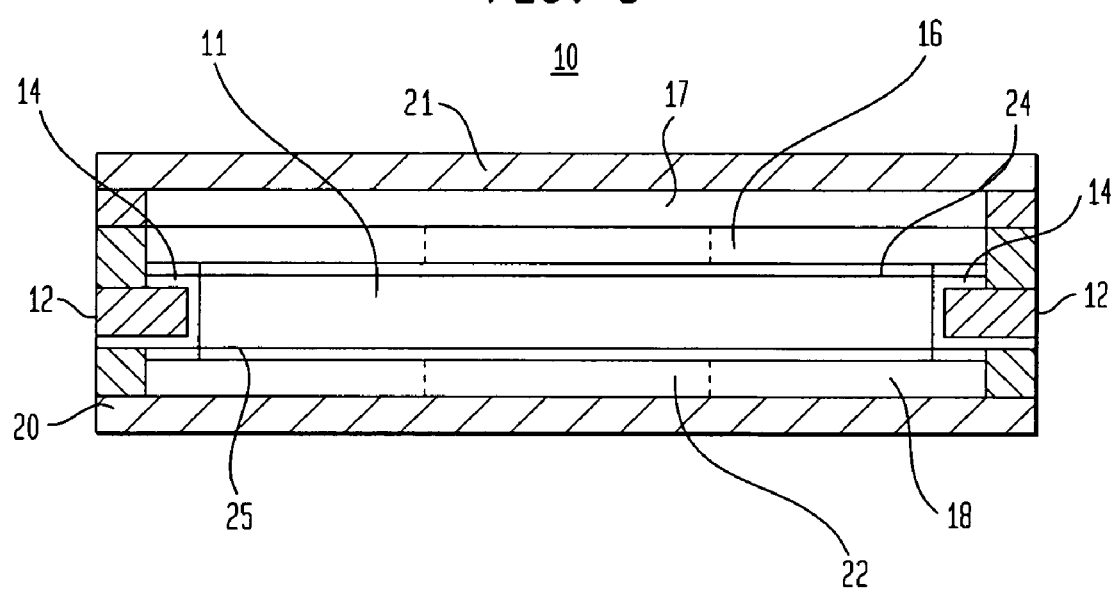
FIG. 3 is a cross-sectional view of the piezoelectric resonator stress relief device of the present invention.

FIG. 2 is a top view of piezoelectric resonator restraint assembly 15 of the present invention, using like numerals for the same structures, comprising the spring cushions 14 holding the piezoelectric resonator plate 11 in place on the piezoelectric resonator restraint assembly 15. FIG. 3 is a cross-section view of the piezoelectric resonator stress relief apparatus 10 of the present invention, using like numerals for the same structures, with the different layers stacked together. The piezoelectric resonator plate 11 is shown restrained by the lateral restraining means 12 and spring cushions 14. The layers above the piezoelectric resonator plate 11 are the upper plate 16, gasket 17 and upper lid 21. The layers below the piezoelectric resonator plate 11 are the lower plate 18 and lower lid 20.

A number of variations of the piezoelectric resonator stress relief device are within the contemplation of the present invention. For example, each spring cushion 14 may be formed as a separate component and assembled together with the piezoelectric components and then further assembled together with the piezoelectric resonator plate 11 and the lateral restraint means 12. The spring cushions 14 may be configured as either an integral part of the piezoelectric resonator plate 11 or the lateral restraint means 12. The spring cushions 14 can also be configured as an integral part of a monolithic resonator-spring-restraint assembly. The lateral profiles of both the piezoelectric resonator plate 11 and the lateral restraint means 12 are illustrated as rectangular, but are not constrained to that geometry to be a part of this invention. Other shapes, including circular and oval geometries are also considered to be within the contemplation of the present invention.

Other variations of the piezoelectric resonator stress relief apparatus include the piezoelectric resonator plate being a bulk acoustic wave resonator (BAW), a BAW resonator having a plano-convex thickness profile, or a BAW resonator having a bi-convex thickness profile. The piezoelectric resonator plate can also be a surface acoustic wave resonator (SAW), a SAW resonator having a plano-plano thickness profile or a quartz crystal resonator. The present invention also contemplates a top conductive vacuum lubricant layer 24 above the piezoelectric resonator plate 11, a bottom conductive vacuum lubricant layer below 25 the piezoelectric resonator plate 11, the top and bottom vacuum lubricant layers 24 and 25, respectively, providing lubrication to accommodate thermal expansion, the gasket being a vertical tensioner gasket with a soft texture for thermal expansion and the upper and lower lids being configured as package covers.

Figure 4:
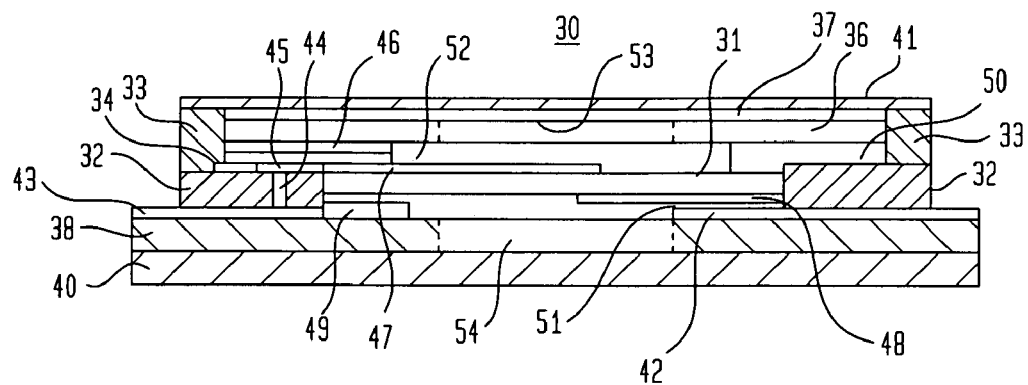
FIG. 4 is a cross sectional view of a second embodiment of the piezoelectric resonator stress relief device of the present invention.

FIG. 4 is a cross sectional view of the second embodiment of the piezoelectric resonator stress relief device 30 of the present invention comprising an assembly restraining the piezoelectric resonator plate 31 along with electrical connections and vacuum lubrication areas. The layers above the piezoelectric resonator plate 31 are an upper electrode 47, a metallization region 45 disposed on a means for lateral restraint 32, a top conductive vacuum lubricant layer 52, a non-conductive top vacuum lubricant layer 50, a metallization region 46 disposed underneath a rigid upper plate 36, a gasket 37 and an upper lid 41. The lateral restraint means 32 includes a pair of upper sidewalls 33 and a plurality of spring cushions 34. The layers below the piezoelectric resonator plate 31 are a lower electrode 48, a bottom conductive vacuum lubricant layer 51, means for external electrical connections 42 and 43 on a lower plate 38, a non-conducting bottom vacuum lubricant layer 49 and a lower lid 40. The upper plate 36 having an opening 53 and the lower plate 38 having an opening 54. The external electrical connection means 42 and 43 are metallization regions located on lower plate 38. A filled conductive area 44 is located within a hollow portion of the lateral restraint means 32. The metallization region 45 is disposed on the lateral piezoelectric restraint means and metallization region 46 is disposed on the upper plate 36. The metallization regions 44–46, upper and lower electrodes 47 and 48 and the conductive vacuum lubricant regions 51 and 52 provide electrical connection from the external connection means 42 and 43 to the piezoelectric resonator assembly. In this second embodiment, the top and bottom vacuum lubricant layers 49–52 accommodate thermal expansion of the various layers. Additionally, both the top and bottom lubricant layers 49–52 permit the piezoelectric resonator plate 31 to slide over ceramic surfaces of the upper plate 36 and lower plate 38. Several variations of the piezoelectric resonator stress relief apparatus also apply to this second embodiment.

Figure 5:
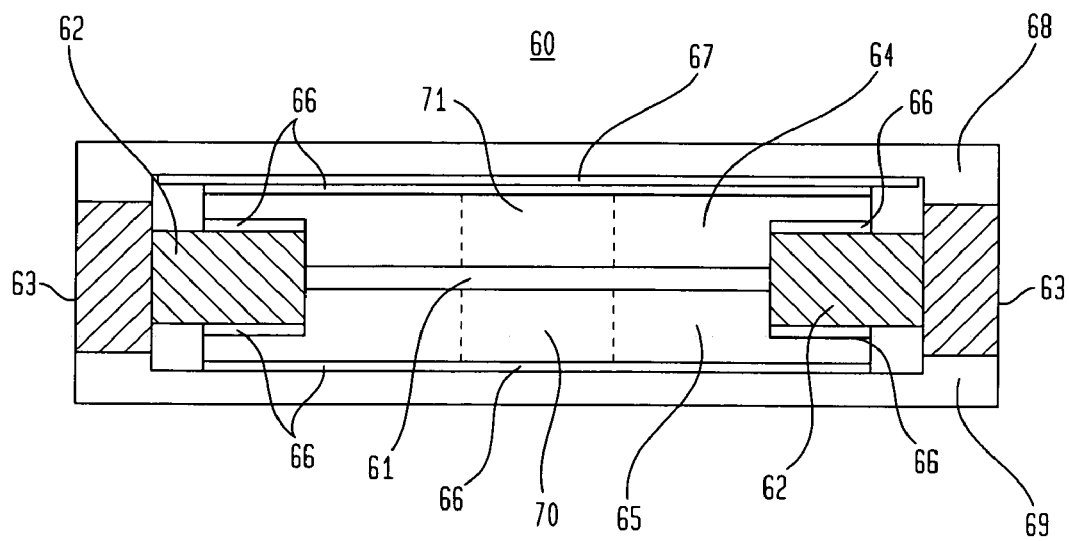
FIG. 5 is a cross sectional view of the piezoelectric resonator stress relief packaging system embodiment of the present invention.

FIG. 5 illustrates a third embodiment of this invention, which is a piezoelectric resonator stress relief packaging system 60 wherein the upper plate 64 and lower plate 65 are configured to move laterally with the piezoelectric resonator plate 61 and still restrain vertical displacement of the piezoelectric resonator plate 61. In this embodiment, a means for lateral restraint 62 and a plurality of spring cushions 63 restrain the piezoelectric resonator plate 61. The layers above the piezoelectric resonator plate 61 are the upper plate 64, a thermal expansion gasket 67 and an upper package cover 68. The thermal expansion gasket 67 is needed to alleviate excessive vertical pre-tensioning and should be compatible with a high vacuum, but must either be much softer than the resonator plate 61, spring cushions 63 and other components, or have a prescribed thermal expansion to compensate for the other components or both. In order to maintain freedom of lateral movement, a high-vacuum compatible lubricant 66, such as Apiezon® grease, is placed between the upper plate 64 and thermal expansion gasket 67. An upper opening 71 is placed through the upper plate 64. The layers below the piezoelectric resonator 61 are the lower plate 65 and lower package cover 69. High-vacuum compatible lubricant 66, is also placed between the lower plate 65 and lower package cover 69 to maintain freedom of lateral movement. A lower opening 70 is also provided through the lower plate 65. In this embodiment, the upper package cover 68 and lower package cover 69 are configured to laterally restrain the upper plate 64 and lower plate 65 in the same way that piezoelectric resonator plate 61 is laterally restrained in order to prevent out-of-plane movement by the upper and lower plates 64 and 65. Appropriate electrical connections to the piezoelectric resonator plate 61 are required, but are not shown in this drawing. Many of the variations of the piezoelectric resonator restraint apparatus and piezoelectric resonator restraint device also apply to this third embodiment.

Figure 6A:
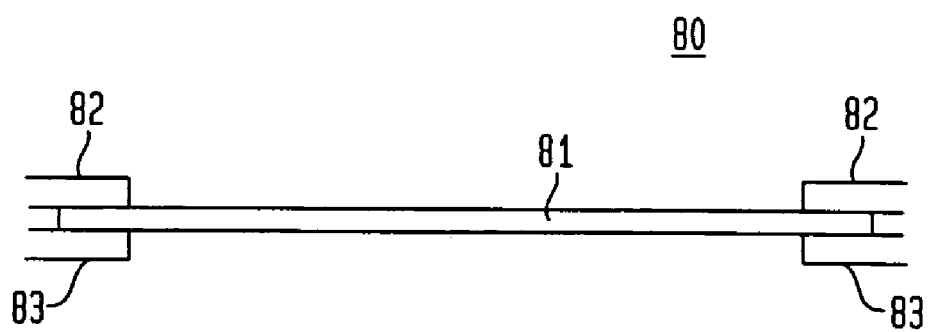
FIG. 6 is a conceptual diagram illustrating side views of three alternate embodiments of piezoelectric assemblies and mounting devices in accordance with the present invention.
Figure 6B:
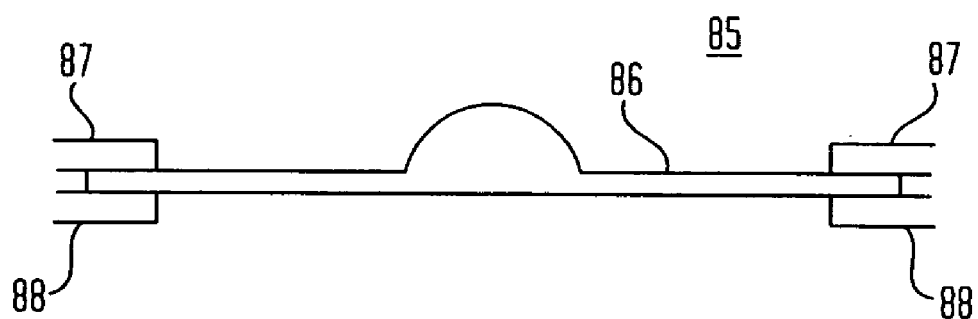
Figure 6C:
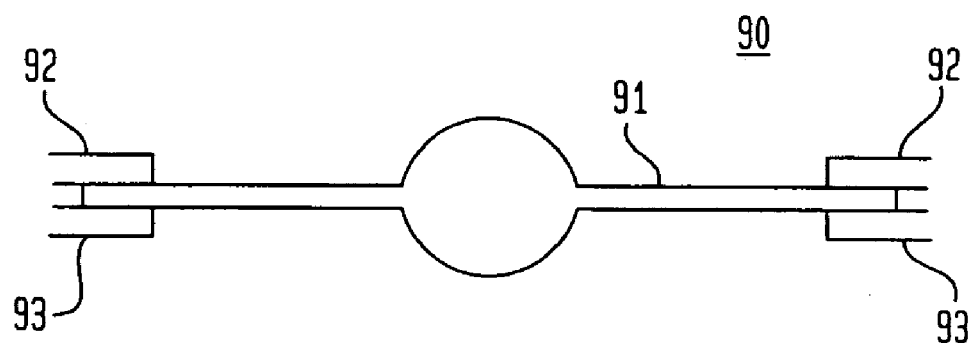

FIGS. 6A–6C are conceptual diagrams illustrating side views of three alternate embodiments of piezoelectric assemblies in mounting devices in accordance with the present invention. FIGS. 6A–6C illustrate different shapes for the piezoelectric resonator that are compatible with the structure of the invention, i.e. where there is a convex contour, the contour should preferably be limited to the area defined by the openings in the upper and lower plates, otherwise the lateral movement will be inhibited. This is an issue for plano-convex and bi-convex BAW resonators, but is not an issue for plano-plano BAW or surface wave resonators. Although the devices of the present invention are operable with all of these different shapes, it is most likely that the surface wave devices would be built with plano-plano substrates only, while BAW would likely involve a contoured surface for energy trapping. The piezoelectric assembly may be a bulk acoustic resonator (BAW) or a surface acoustic wave resonator (SAW). The BAW resonator may have the plano-plano thickness profile depicted in FIG. 6A, the plano-convex thickness profile depicted in FIG. 6B or the bi-convex thickness profile depicted in FIG. 6C. The SAW resonator would typically have the FIG. 6A plano-plano thickness profile.

Referring now to the drawings, FIG. 6A illustrates the plano-plano thickness profile, with a device 80 further comprising a piezoelectric resonator plate 81 restrained by a pair of integrated upper spring cushions 82 and a pair of integrated lower spring cushions 83. FIG. 6B illustrates the plano-convex thickness profile, with a device 85 further comprising a piezoelectric resonator plate 86 restrained by a pair of integrated upper spring cushions 87 and a pair of integrated lower spring cushions 88. FIG. 6C illustrates the bi-convex thickness profile, with a device 90 further comprising a piezoelectric resonator plate 91 restrained by a pair of integrated upper spring cushions 92 and a pair of integrated lower spring cushions 93.

While not precluded by this invention, plano-concave or bi-concave thickness profiles are not normally used for BAW resonators, and other than plano-plano thickness profiles are not normally used for SAW resonators.

It is to be understood that such other features and modifications to the foregoing detailed description are within the contemplation of the invention, which is not limited by this description. As will be further appreciated by those skilled in the art, any number of variations and configurations, as well any number of combinations of circuits, differing materials and dimensions can achieve the results described herein. Accordingly, the present invention should not be limited by the foregoing description, but only by the appended claims.

I claim:

1. A piezoelectric resonator acceleration-induced stress relief apparatus, comprising:
    a piezoelectric resonator plate, having a given frequency, is positioned on a piezoelectric restraint assembly;
    a rigid upper plate and a gasket being stacked on said piezoelectric resonator plate, said upper plate having a first opening and being enclosed by an upper lid;
    a rigid lower plate being positioned under said piezoelectric restraint assembly, said lower plate having a second opening and being enclosed by a lower lid;
    said openings define a plurality of traction-free surfaces on a plurality of piezoelectrically active areas of said piezoelectric resonator plate;
    said upper plate and said lower plate being configured to move laterally with said piezoelectric resonator plate and still restrain a vertical displacement of said piezoelectric resonator plate;
    said piezoelectric resonator plate being stacked between said upper plate and said piezoelectric restraint assembly causes a precise orientation of said piezoelectric resonator plate and a reduced out-of-plane acceleration-induced deformation;
    said reduced out-of-plane acceleration-induced deformation being readily negated by an aspect-ratio compensation applied through said openings;
    said piezoelectric restraint assembly, having a means for lateral restraint further comprising a plurality of spring cushions impinging said piezoelectric resonator plate provides said piezoelectric resonator plate with a rigid peripheral support, permitting an in-plane stress relief minimizing unwanted lateral movement and a reduced in-plane acceleration-induced deformation; and
    said reduced out-of-plane acceleration-induced deformation and said reduced in-plane acceleration-induced deformation resulting in a more precise aspect ratio yield, a decreased acceleration sensitivity and a decreased amount of acceleration-induced frequency shifts in said piezoelectric resonator plate.

2. The piezoelectric resonator acceleration-induced stress relief apparatus, as recited in claim 1, wherein said in-plane stress relief reduces said plurality of in-plane acceleration-induced deformation to a translation.

3. The piezoelectric resonator acceleration-induced stress relief apparatus, as recited in claim 2, wherein minimizing lateral movement reduces said out-of-plane acceleration-induced deformation to a flexure.

4. The piezoelectric resonator acceleration-induced stress relief apparatus, as recited in claim 3, further comprising said plurality of spring cushions impinging a plurality of edges of the piezoelectric resonator plate.

5. The piezoelectric resonator acceleration-induced stress relief apparatus, as recited in claim 4, further comprising said piezoelectric resonator plate being a bulk acoustic wave resonator (BAW).

6. The piezoelectric resonator acceleration-induced stress relief apparatus, as recited in claim 5, further comprising said BAW resonator having a plano-convex thickness profile.

7. The piezoelectric resonator acceleration-induced stress relief apparatus, as recited in claim 5, further comprising said BAW resonator having a bi-convex thickness profile.

8. The piezoelectric resonator acceleration-induced stress relief apparatus, as recited in claim 4, further comprising said piezoelectric resonator plate being a surface acoustic wave resonator (SAW).

9. The piezoelectric resonator acceleration-induced stress relief apparatus, as recited in claim 8, further comprising said SAW resonator having a plano-plano thickness profile.

10. The piezoelectric resonator acceleration-induced stress relief apparatus, as recited in claim 4, further comprising said piezoelectric resonator plate being a quartz crystal resonator.

11. The piezoelectric resonator acceleration-induced stress relief apparatus, as recited in claim 4, further comprising said plurality of spring cushions being configured as an integral part of said piezoelectric resonator plate.

12. The piezoelectric resonator acceleration-induced stress relief apparatus, as recited in claim 4, further comprising said plurality of spring cushions being configured as an integral part of said lateral restraining means.

13. The piezoelectric resonator acceleration-induced stress relief apparatus, as recited in claim 4, further comprising said plurality of spring cushions being configured as an integral part of a monolithic resonator-spring-restraint assembly.

14. The piezoelectric resonator acceleration-induced stress relief apparatus, as recited in claim 4, further comprising a top conductive vacuum lubricant layer above said piezoelectric resonator plate.

15. The piezoelectric resonator acceleration-induced stress relief apparatus, as recited in claim 13, further comprising a bottom conductive vacuum lubricant layer below said piezoelectric resonator plate.

16. The piezoelectric resonator acceleration-induced stress relief apparatus, as recited in claim 14, wherein said top vacuum lubricant layer and said bottom vacuum lubricant layer provide lubrication to accommodate thermal expansion.

17. The piezoelectric resonator acceleration-induced stress relief apparatus, as recited in claim 4, said gasket being a vertical tensioner gasket having a soft texture to permit thermal expansion.

18. The piezoelectric resonator acceleration-induced stress relief apparatus, as recited in claim 4, further comprising said upper lid being configured as an upper package cover.

19. The piezoelectric resonator acceleration-induced stress relief apparatus, as recited in claim 4, further comprising said lower lid being configured as a lower package cover.

20. A piezoelectric resonator acceleration-induced stress relief device, comprising:
a piezoelectric resonator plate, having a given frequency, is positioned on a piezoelectric restraint assembly;
an upper electrode, a top conductive vacuum lubricant layer, a plurality of top metallization regions, a rigid upper plate and a gasket being stacked on said piezoelectric resonator plate, said upper plate having a first opening and being enclosed by an upper lid;
a rigid lower plate being positioned under said piezoelectric restraint assembly;
a lower electrode, a bottom conductive vacuum lubricant layer, a bottom non-conductive vacuum lubricant layer, a first and second means for external electrical connections and said lower plate are stacked beneath said piezoelectric restraint assembly;
said lower plate having a second opening and being enclosed by a lower lid;
said openings define a plurality of traction-free surfaces on a plurality of piezoelectrically active areas of said piezoelectric resonator plate;
said upper plate and said lower plate being configured to move laterally with said piezoelectric resonator plate and still restrain a vertical displacement of said piezoelectric resonator plate;
said piezoelectric resonator plate being stacked between said upper plate and said piezoelectric restraint assembly causes a precise orientation of said piezoelectric resonator plate and a reduced out-of-plane acceleration-induced deformation;
said reduced out-of-plane acceleration-induced deformation being readily negated by an aspect-ratio compensation applied through said openings;
said piezoelectric restraint assembly, having a means for lateral restraint further comprising a plurality of spring cushions impinging said piezoelectric resonator plate provides said piezoelectric resonator plate with a rigid peripheral support, permitting an in-plane stress relief minimizing lateral unwanted movement and a reduced in-plane acceleration-induced deformation; and
said reduced out-of-plane acceleration-induced deformation and said reduced in-plane acceleration-induced deformation resulting in a more precise aspect ratio yield, a decreased acceleration sensitivity and a decreased amount of acceleration-induced frequency shifts in said piezoelectric resonator plate.

21. The piezoelectric resonator acceleration-induced stress relief device, as recited in claim 20, further comprising said first and second means for external electrical connections being located on said lower plate.

22. The piezoelectric resonator acceleration-induced stress relief device, as recited in claim 21, further comprising a filled conductive area being located within a hollow portion of said piezoelectric restraint assembly.

23. The piezoelectric resonator acceleration-induced stress relief device, as recited in claim 22, further comprising said plurality of top metallization regions, said upper electrode, said top conductive vacuum lubricant layer, said lower electrode, said bottom conductive vacuum lubricant layer and said first and second electrical connection means permit an electrical current to pass more readily through the piezoelectric resonator assembly.

24. The piezoelectric resonator acceleration-induced stress relief device, as recited in claim 23, further comprising an upper circuit and a lower circuit.

25. The piezoelectric resonator acceleration-induced stress relief device, as recited in claim 24, further comprising said top and bottom conductive vacuum lubricant layers accommodate a thermal expansion of said device.

26. The piezoelectric resonator acceleration-induced stress relief device, as recited in claim 25, further comprising said top and bottom conductive vacuum lubricant layers permit the piezoelectric resonator plate to slide over said upper plate and said lower plate.

27. The piezoelectric resonator acceleration-induced stress relief device, as recited in claim 26, wherein said in-plane stress relief reduces said plurality of in-plane acceleration-induced deformation to a translation.

28. The piezoelectric resonator acceleration-induced stress relief device, as recited in claim 27, wherein minimizing lateral movement reduces said out-of-plane acceleration-induced deformation to a flexure.

29. The piezoelectric resonator acceleration-induced stress relief device, as recited in claim 28, further comprising said plurality of spring cushions impinging a plurality of edges of the piezoelectric resonator plate.

30. The piezoelectric resonator acceleration-induced stress relief device, as recited in claim 29, further comprising said piezoelectric resonator plate being a bulk acoustic wave resonator (BAW).

31. The piezoelectric resonator acceleration-induced stress relief device, as recited in claim 30, further comprising said BAW resonator having a plano-convex thickness profile.

32. The piezoelectric resonator acceleration-induced stress relief device, as recited in claim 30, further comprising said BAW resonator having a bi-convex thickness profile.

33. The piezoelectric resonator acceleration-induced stress relief device, as recited in claim 29, further comprising said piezoelectric resonator plate being a surface acoustic wave resonator (SAW).

34. The piezoelectric resonator acceleration-induced stress relief device, as recited in claim 33, further comprising said SAW resonator having a plano-plano thickness profile.

35. The piezoelectric resonator acceleration-induced stress relief device, as recited in claim 29, further comprising said piezoelectric resonator plate being a quartz crystal resonator.

36. The piezoelectric resonator acceleration-induced stress relief device, as recited in claim 29, further comprising said plurality of spring cushions being configured as an integral part of said piezoelectric resonator plate.

37. The piezoelectric resonator acceleration-induced stress relief device, as recited in claim 29, further comprising said plurality of spring cushions being configured as an integral part of said lateral restraining means.

38. The piezoelectric resonator acceleration-induced stress relief device, as recited in claim 29, further comprising said plurality of spring cushions being configured as an integral part of a monolithic resonator-spring-restraint assembly.

39. The piezoelectric resonator acceleration-induced stress relief device, as recited in claim 29, further comprising said gasket being a thermal expansion gasket having a soft texture to permit thermal expansion.

40. The piezoelectric resonator acceleration-induced stress relief device, as recited in claim 29, further comprising said upper lid being configured as an upper package cover.

41. The piezoelectric resonator acceleration-induced stress relief device, as recited in claim 29, further comprising said lower lid being configured as a lower package cover.

42. A piezoelectric resonator acceleration-induced stress relief packaging system, comprising:
- a piezoelectric resonator plate, having a given frequency, is positioned on a piezoelectric restraint assembly;
- a rigid upper plate and a thermal expansion gasket being stacked on said piezoelectric resonator plate, said upper plate having a first opening and being enclosed by an upper package cover;
- a rigid lower plate being positioned under said piezoelectric restraint assembly, said lower plate having a second opening and being enclosed by a lower package cover;
- said openings define a plurality of traction-free surfaces on a plurality of piezoelectrically active areas of said piezoelectric resonator plate;
- said upper plate and said lower plate being configured to move laterally with said piezoelectric resonator plate and still restrain a vertical displacement of said piezoelectric resonator plate;
- said piezoelectric resonator plate being stacked between said upper plate and said piezoelectric restraint assembly causes a precise orientation of said piezoelectric resonator plate and a reduced out-of-plane acceleration-induced deformation;
- said reduced out-of-plane acceleration-induced deformation being readily negated by an aspect-ratio compensation applied through said openings;
- said piezoelectric restraint assembly, having a means for lateral restraint further comprising a plurality of spring cushions impinging said piezoelectric resonator plate provides said piezoelectric resonator plate with a rigid peripheral support, permitting an in-plane stress relief minimizing unwanted lateral movement and a reduced in-plane acceleration-induced deformation; and
- said reduced out-of-plane acceleration-induced deformation and said reduced in-plane acceleration-induced deformation resulting in a more precise aspect ratio yield, a decreased acceleration sensitivity and a decreased amount of acceleration-induced frequency shifts in said piezoelectric resonator plate.

43. The piezoelectric resonator acceleration-induced stress relief packaging system, as recited in claim 42, wherein said in-plane stress relief reduces said plurality of in-plane acceleration-induced deformation to a translation.

44. The piezoelectric resonator acceleration-induced stress relief packaging system, as recited in claim 43, wherein minimizing lateral movement reduces said out-of-plane acceleration-induced deformation to a flexure.

45. The piezoelectric resonator acceleration-induced stress relief packaging system, as recited in claim 44, further comprising said plurality of spring cushions impinging a plurality of edges of the piezoelectric resonator plate.

46. The piezoelectric resonator acceleration-induced stress relief packaging system, as recited in claim 45, further comprising said piezoelectric resonator plate being a bulk acoustic wave resonator (BAW).

47. The piezoelectric resonator acceleration-induced stress relief packaging system, as recited in claim 46, further comprising said BAW resonator having a plano-convex thickness profile.

48. The piezoelectric resonator acceleration-induced stress relief packaging system, as recited in claim 46, further comprising said BAW resonator having a bi-convex thickness profile.

49. The piezoelectric resonator acceleration-induced stress relief packaging system, as recited in claim 45, further comprising said piezoelectric resonator plate being a surface acoustic wave resonator (SAW).

50. The piezoelectric resonator acceleration-induced stress relief packaging system, as recited in claim 49, further comprising said SAW resonator having, a plano-plano thickness profile.

51. The piezoelectric resonator acceleration-induced stress relief packaging system, as recited in claim 45, further comprising said piezoelectric resonator plate being a quartz crystal resonator.

52. The piezoelectric resonator acceleration-induced stress relief packaging system, as recited in claim 45, further comprising said plurality of spring cushions being configured as an integral part of said piezoelectric resonator plate.

53. The piezoelectric resonator acceleration-induced stress relief packaging system, as recited in claim 45, further comprising said plurality of spring cushions being configured as an integral part of said lateral restraining means.

54. The piezoelectric resonator acceleration-induced stress relief packaging system, as recited in claim 45, further comprising said plurality of spring cushions being configured as an integral part of a monolithic resonator-spring-restraint assembly.

55. The piezoelectric resonator acceleration-induced stress relief packaging system, as recited in claim 45, further comprising a top vacuum lubricant layer between said upper plate and said thermal expansion gasket.

56. The piezoelectric resonator acceleration-induced stress relief packaging system, as recited in claim 55, further comprising a bottom vacuum lubricant layer between said lower plate and said lower package cover.

57. The piezoelectric resonator acceleration-induced stress relief packaging system, as recited in claim 56, wherein said top vacuum lubricant layer and said bottom vacuum lubricant layer provide lubrication to accommodate thermal expansion.

58. The piezoelectric resonator acceleration-induced stress relief packaging system, as recited in claim 45, further comprising said thermal expansion gasket having a soft texture to permit thermal expansion.

59. A monolithic piezoelectric resonator acceleration-induced stress relief packaging system, comprising:
- a piezoelectric resonator plate, having a given frequency, is inserted in a means for lateral restraint;
- a rigid upper plate and a thermal gasket being stacked on said piezoelectric resonator plate, said upper plate having a first opening and being enclosed by an upper package cover;
- a rigid lower plate being positioned under said lateral restraint means, said lower plate having a second opening and being enclosed by a lower package cover;

said openings define a plurality of traction-free surfaces on a plurality of piezoelectrically active areas of said piezoelectric resonator plate:

said upper plate and said lower plate being configured to move laterally with said piezoelectric resonator plate and still restrain a vertical displacement of said piezoelectric resonator plate;

said piezoelectric resonator plate being stacked between said upper plate and said lateral restraint means causes a precise orientation of said piezoelectric resonator plate and a reduced out-of-plane acceleration-induced deformation;

said reduced out-of-plane acceleration-induced deformation being readily negated by an aspect-ratio compensation applied through said openings;

said lateral restraint means, having a plurality of built-in spring cushions impinging said piezoelectric resonator plate provides said piezoelectric resonator plate with a rigid peripheral support, permitting an in-plane stress relief minimizing unwanted lateral movement and a reduced in-plane acceleration-induced deformation; and said reduced out-of-plane acceleration-induced deformation and said reduced in-plane acceleration-induced deformation resulting in a more precise aspect ratio yield, a decreased acceleration sensitivity and a decreased amount of acceleration-induced frequency shifts in said piezoelectric resonator plate.

60. The monolithic piezoelectric resonator acceleration-induced stress relief packaging system, as recited in claim 59, wherein said in-plane stress relief reduces said plurality of in-plane acceleration-induced deformation to a translation.

61. The monolithic piezoelectric resonator acceleration-induced stress relief packaging system, as recited in claim 60, wherein minimizing lateral movement reduces said out-of-plane acceleration-induced deformation to a flexure.

62. The monolithic piezoelectric resonator acceleration-induced stress relief packaging system, as recited in claim 61, further comprising said plurality of spring cushions impinging a plurality of edges of the piezoelectric resonator plate.

63. The monolithic piezoelectric resonator acceleration-induced stress relief packaging system, as recited in claim 62, further comprising said piezoelectric resonator plate being a bulk acoustic wave resonator (BAW).

64. The monolithic piezoelectric resonator acceleration-induced stress relief packaging system, as recited in claim 63, further comprising said BAW resonator having a plano-convex thickness profile.

65. The monolithic piezoelectric resonator acceleration-induced stress relief packaging system, as recited in claim 63, further comprising said BAW resonator having a bi-convex thickness profile.

66. The monolithic piezoelectric resonator acceleration-induced stress relief packaging system, as recited in claim 62, further comprising said piezoelectric resonator plate being a surface acoustic wave resonator (SAW).

67. The monolithic piezoelectric resonator acceleration-induced stress relief packaging system, as recited in claim 66, further comprising said SAW resonator having a plano-plano thickness profile.

68. The monolithic piezoelectric resonator acceleration-induced stress relief packaging system, as recited in claim 62, further comprising said piezoelectric resonator plate being a quartz crystal resonator.

69. The monolithic piezoelectric resonator acceleration-induced stress relief packaging system, as recited in claim 62, further comprising a top conductive vacuum lubricant layer above said piezoelectric resonator plate.

70. The monolithic piezoelectric resonator acceleration-induced stress relief packaging system, as recited in claim 69, further comprising a bottom conductive vacuum lubricant layer below said piezoelectric resonator plate.

71. The monolithic piezoelectric resonator acceleration-induced stress relief packaging system, as recited in claim 70, wherein said top vacuum lubricant layer and said bottom vacuum lubricant layer provide lubrication to accommodate thermal expansion.

72. The monolithic piezoelectric resonator acceleration-induced stress relief packaging system, as recited in claim 62, further comprising said thermal expansion gasket having a soft texture to permit thermal expansion.

* * * * *